United States Patent
Kimmlingen et al.

(10) Patent No.: US 7,852,086 B2
(45) Date of Patent: Dec. 14, 2010

(54) ARRANGEMENT TO CORRECT EDDY CURRENTS IN A GRADIENT COIL

(75) Inventors: Ralph Kimmlingen, Nuremberg (DE); Johann Schuster, Oberasbach (DE)

(73) Assignee: Siemens Aktiengesellschaft, Munich (DE)

( * ) Notice: Subject to any disclaimer, the term of this patent is extended or adjusted under 35 U.S.C. 154(b) by 93 days.

(21) Appl. No.: 12/401,999

(22) Filed: Mar. 11, 2009

(65) Prior Publication Data

US 2009/0230964 A1    Sep. 17, 2009

(30) Foreign Application Priority Data

Mar. 17, 2008   (DE) .................. 10 2008 014 632

(51) Int. Cl.
*G01V 3/00* (2006.01)
(52) U.S. Cl. ..................... 324/322; 324/318
(58) Field of Classification Search ............. 324/322, 324/318
See application file for complete search history.

(56) References Cited

U.S. PATENT DOCUMENTS

| | | | | |
|---|---|---|---|---|
| 4,733,189 A | * | 3/1988 | Punchard et al. | 324/318 |
| 4,794,338 A | * | 12/1988 | Roemer et al. | 324/319 |
| 4,978,920 A | * | 12/1990 | Mansfield et al. | 324/318 |
| 6,054,854 A | * | 4/2000 | Kawamoto | 324/318 |
| 6,285,188 B1 | | 9/2001 | Sakakura | |
| 6,515,479 B1 | | 2/2003 | Arz et al. | |
| 7,069,195 B2 | * | 6/2006 | Hasegawa | 703/2 |
| 7,230,426 B2 | | 6/2007 | Evans | |
| 7,576,540 B2 | * | 8/2009 | Abe et al. | 324/318 |
| 7,589,531 B2 | * | 9/2009 | Yamashita et al. | 324/318 |
| 2002/0135369 A1 | | 9/2002 | Joseph | |

* cited by examiner

*Primary Examiner*—Louis M Arana
(74) *Attorney, Agent, or Firm*—Schiff Hardin LLP

(57) ABSTRACT

In an arrangement to correct eddy currents in a gradient coil of a magnetic resonance apparatus, the gradient coil having a primary gradient sub-coil and a secondary gradient sub-coil connected in series with the primary gradient sub-coil, the secondary gradient sub-coil is coupled with the primary gradient sub-coil such that the same magnitude gradient current flows through both (but in different directions) in order to compensate for magnetic field distortions of the primary gradient sub-coil. The primary gradient sub-coil has a first impedance while the secondary gradient sub-coil has a second impedance. A tuning impedance is connected in parallel with at least one of the two impedances.

9 Claims, 3 Drawing Sheets

ARRANGEMENT TO CORRECT EDDY CURRENTS IN A GRADIENT COIL

BACKGROUND OF THE INVENTION

1. Field of the Invention

The present invention concerns an arrangement to correct eddy currents in a gradient coil of a magnetic resonance apparatus.

2. Description of the Prior Art

Magnetic resonance apparatuses are known that have actively shielded gradient coils. A gradient coil is associated with each spatial direction, i.e., with each spatial coordinate axis. The three gradient coils form a gradient coil system.

The gradient coil system normally is surrounded by conductive structures, in which the eddy currents are induced by switched gradient fields. The magnetic fields generated by the eddy currents attenuate and distort the time curve of the desired gradient field. Actively shielded gradient coils are used in order to largely compensate for the field distortions. For example, a shielding coil associated with a gradient coil has a lower winding count and is associated with the gradient coil such that the same current magnitude that flows through the gradient coil also flows through the shielding coil, but in the opposite direction.

Due to the connective wiring, the shielding coil is generally designated as a secondary gradient sub-coil while the field-generating gradient sub-coil that is actually required for magnetic resonance imaging is designated as a primary gradient coil.

For these gradient coils it is absolutely necessary to limit or to compensate for structural tolerances that occur in production, since these would lead to deviations of the desired magnetic field curve.

Tolerances in the structure are caused by shifts of conductor trace layers or of conductor trace packets in the axial direction, in the azimuthal direction and in the radial direction.

Unwanted couplings between the gradient coils are caused by the tolerances in the structure, these couplings in turn leading to changes of the inductance of the gradient coil and to changes in the sensitivity.

In particular, shielding errors between the primary gradient coil and the secondary gradient coil are critical, since these become noticeably disruptive in the imaging.

To address the manufacturing tolerances, gradient coils are designed in the framework of a precision production wherein mechanical tools and spacers are used in order to exactly arrange the conductor traces. With such mechanical means it is possible to satisfy the tolerance requirements of the gradient coil system for a magnetic resonance apparatus with a 60 cm patient bore.

Newer magnetic resonance apparatuses with a 70 cm patient bore have a gradient coil with a smaller thickness and therefore a higher sensitivity to mechanical tolerances. Due to the smaller gradient coil thickness, gradient coils of such a design are particularly prone to installation (mounting) deviations that lead to disruptive eddy current influences.

SUMMARY OF THE INVENTION

An object of the present invention is to provide an improved arrangement for correction of eddy currents in an actively shielded gradient coil.

The arrangement according to the invention for correction of eddy currents involved a gradient coil having a primary gradient sub-coil and a secondary gradient sub-coil connected with the primary gradient sub-coil in series. The secondary gradient sub-coil is coupled with the primary gradient sub-coil such that the same gradient current magnitude flows through both (albeit in different directions) in order to compensate for magnetic field distortions of the primary gradient sub-coil.

The primary gradient sub-coil has a first impedance while the secondary gradient sub-coil has a second impedance. According to the invention, a tuning impedance is connected to at least one of the two impedances.

The current through each of the primary and secondary gradient sub-coils is influenced by an ohmic portion of the tuning impedance.

An inductive portion of the tuning impedance enables a minimization of phase errors that would occur at higher frequencies.

Ideally, an inductive portion of the tuning impedance is as large as the inductive portion of the associated impedance connected in parallel.

A capacitive portion of the tuning impedance is minimized in the sense of a geometry optimization.

With the arrangement according to the invention it is possible to achieve respective partial currents in the primary and secondary gradient coils by the use of a voltage splitter, and therefore to reduce the effects of eddy currents.

With the arrangement according to the invention it is possible to retroactively improve already finished, installed gradient coils whose magnetic field deviates from a predetermined value due to manufacturing tolerances.

With the arrangement according to the invention it is also possible to improve gradient coils with smaller production thickness (which are particularly susceptible to installation deviations) with regard to disruptive eddy current effects with little additional expenditure

DESCRIPTION OF THE PREFERRED EMBODIMENTS

Figure 1:
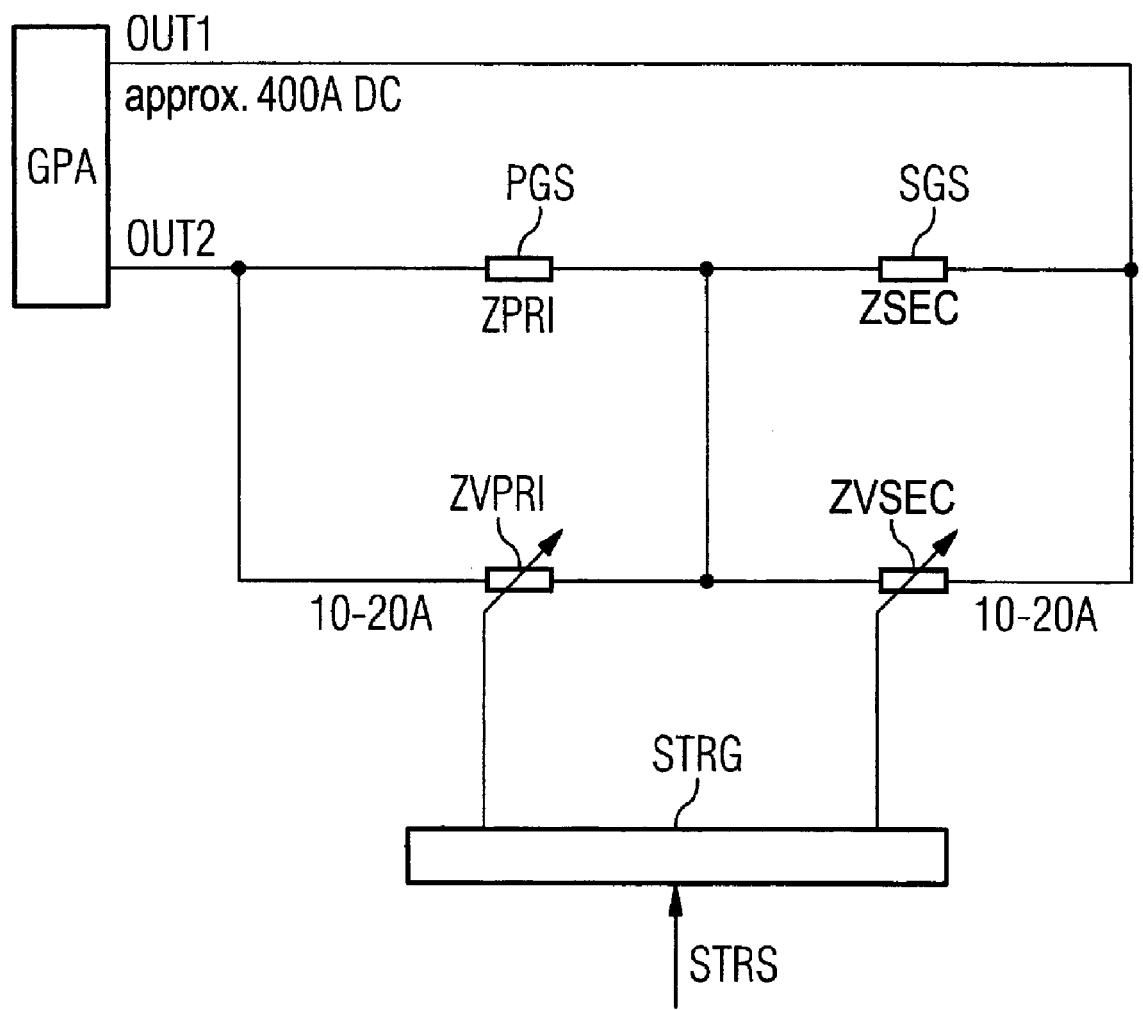
FIG. 1 shows a first embodiment of the arrangement according to the invention.

FIG. 1 shows a first embodiment of the arrangement according to the invention.

Two outputs OUT1, OUT2 of a final power amplifier GPA that is associated with an x-, y- or z-gradient coil are connected with one another via a series circuit that includes a secondary gradient sub-coil SGS and a primary gradient sub-coil PGS.

The secondary gradient sub-coil SGS is thereby coupled with the primary gradient sub-coil PGS such that the same magnitude gradient current flows through both, but in different directions. Magnetic field distortions of the primary gradient sub-coil PGS are compensated by this coupling.

The primary gradient sub-coil PGS has a first impedance ZPRI while the second gradient sub-coil SGS has a second impedance ZSEC.

In the exemplary embodiment shown here, a first tuning impedance ZVPRI is connected in parallel with the first impedance ZPRI while a second tuning impedance ZVSEC is connected in parallel with the second impedance ZSEC.

Depending on the dimensioning, it is possible to connect only one of the tuning impedances ZVPRI, ZVSEC in parallel as described above.

In the exemplary embodiment shown here, the two tuning impedances ZVPRI, ZVSEC are arranged outside of the gradient sub-coils PGS, SGS, and preferably in a common switch box.

This enables a finished, installed gradient coil that embodies both gradient sub-coils PGS, SGS and that does not satisfy the required magnetic field tolerance, to be subsequently turned for a final inspection (acceptance).

If this would not be possible, the entire gradient coil system, with a value of some tens of thousands of euros or dollars would have to be scrapped.

The end power amplifier GPA provides a continuous current at a level of 400 A in order to operate both gradient sub-coils PGS, SGS.

The shown voltage splitter that include the two impedances ZPRI, ZSEC as well as the two tuning impedances ZVPRI, ZVSEC achieves a voltage split of 1/100.

Each tuning impedance ZVPRI and ZVSEC therefore has a value of 10 Ohm while the two impedances ZPRI, ZSEC exhibit a ratio of ZPRI/ZSEC≈0.1 Ohm.

An electric strength of typically 4 kV is to be taken into account in the design of the tuning impedances.

A temperature drift of the two impedances ZPRI, ZSEC to which these are subjected in the operation of the gradient coil is also taken into consideration.

In order to maintain the voltage split cited above, the two tuning impedances ZVPRI, ZVSEC are retuned or updated depending on the temperature drift.

For this purpose, a temperature measurement could ensue inside the two gradient sub-coils PGS, SGS in order to form a control signal STRS representing the temperature. The retuning of the two tuning impedances VPRI, ZVSEC could then be implemented with the aid of the control signal STRS and a controller STRG.

Figure 2:
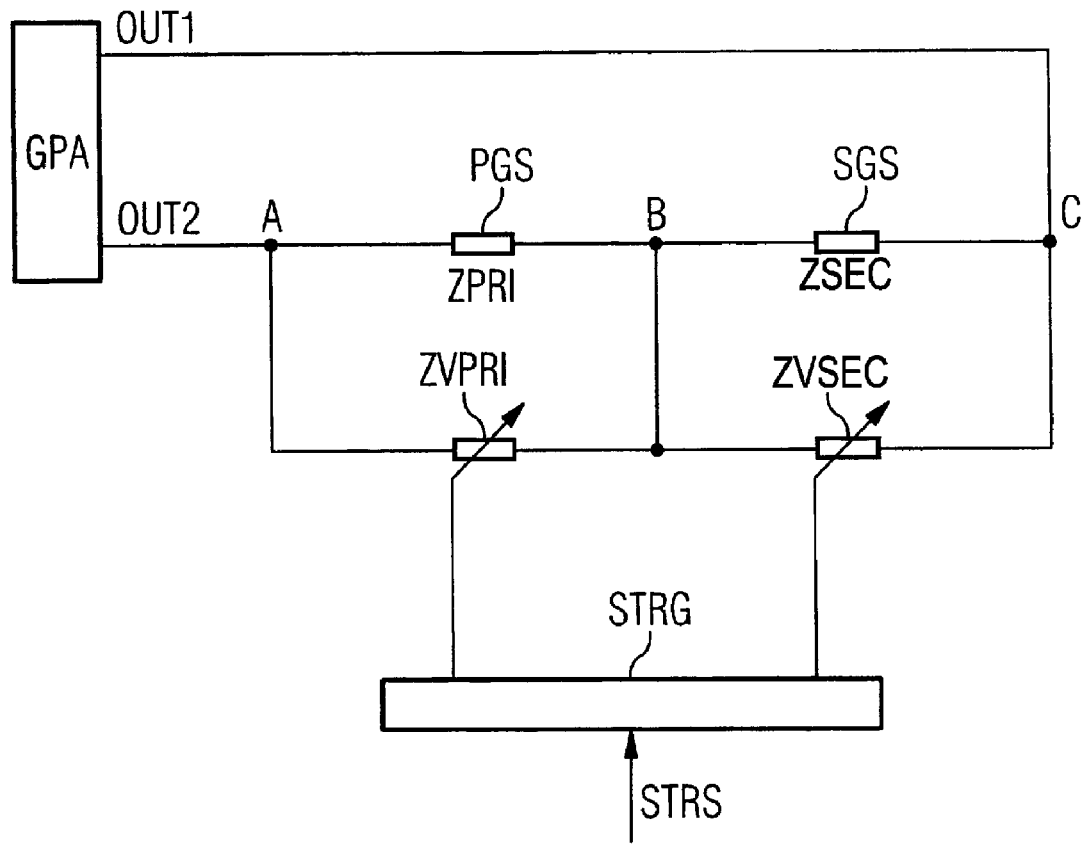
FIG. 2, with reference to FIG. 1, shows retrofitting of a finished, installed gradient coil.
Figure 2:
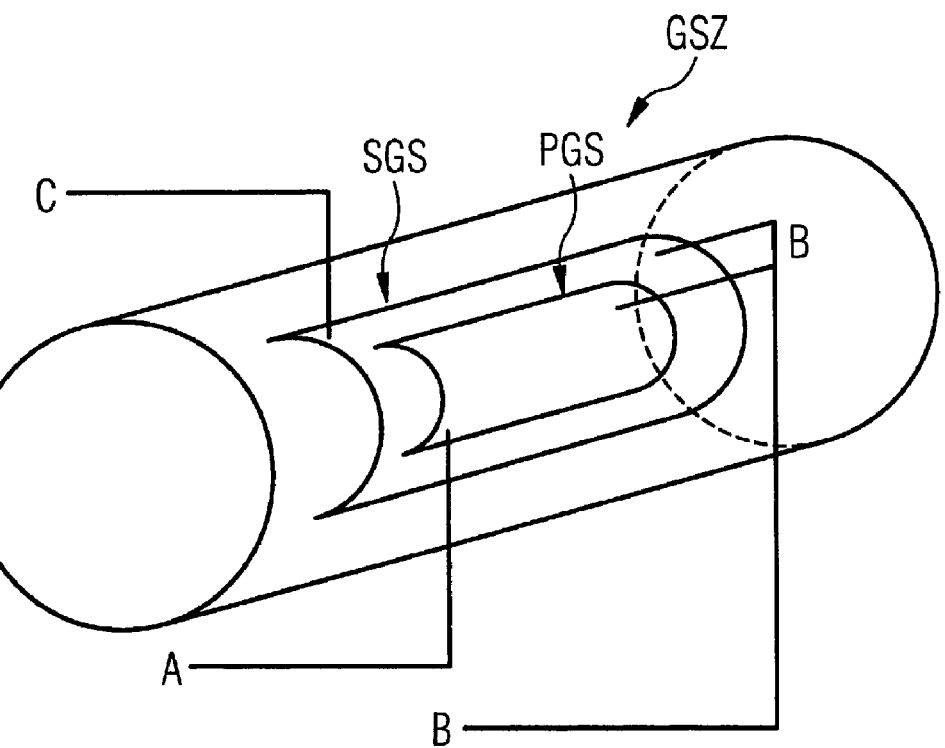

With reference to FIG. 1, FIG. 2 shows a retrofitting of a finished, installed gradient coil GSZ that provides gradient signals for the x-direction, as an example.

The gradient coil GSZ (of which only half is shown here) is fashioned as a saddle coil and has two gradient sub-coils, namely the first, primary gradient sub-coil PGS and the second, secondary gradient sub-coil SGS.

The gradient coil GSZ can be retroactively tuned by connecting the tuning impedances ZVPRI, ZVSEC via the respective connection points A, B and C.

Figure 3:
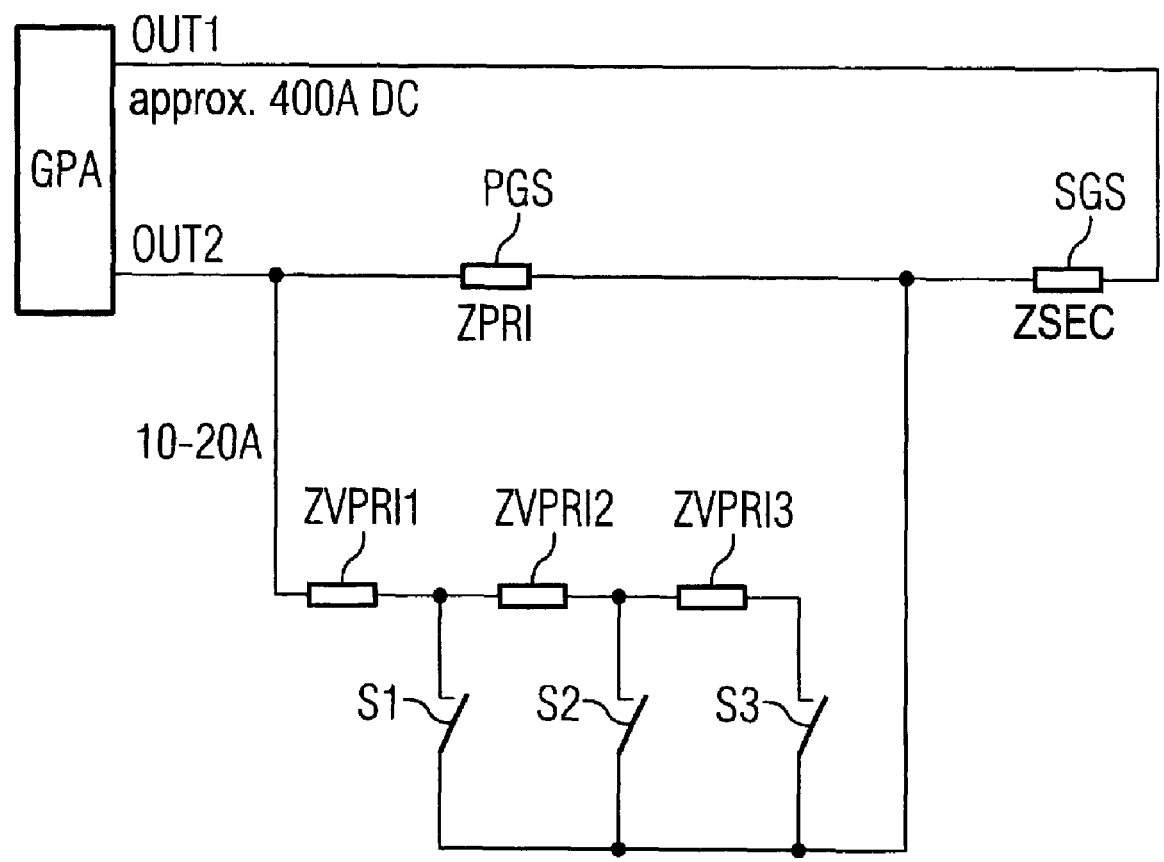
FIG. 3 shows a second embodiment of the arrangement according to the invention.

FIG. 3 shows a second embodiment of the arrangement according to the invention.

Two outputs OUT1, OUT2 of an end power amplifier GPA that is associated with an x-, y- or z-gradient coil are connected with one another via a series circuit made up of a secondary gradient sub-coil SGS and a primary gradient sub-coil PGS.

The secondary gradient sub-coil SGS is coupled with the primary gradient sub-coil PGS such that the same magnitude gradient current flows through both, albeit in different directions. Magnetic field distortions of the primary gradient sub-coil PGS are compensated by this coupling.

The primary gradient sub-coil PGS has a first impedance ZPRI while the second gradient sub-coil SGS has a second impedance ZSEC.

In the exemplary embodiment shown here, a number of tuning impedances ZVPRI1 through ZVPRI3 are connected in parallel with the first impedance ZPRI.

With the use of three switches S1 through S3 it is possible to selectively connect either one or two or all three tuning impedances ZVPRI1 through ZVPRI3.

In the exemplary embodiment shown here, the tuning impedances ZVPRI1 through ZVPRI3 are arranged within the gradient sub-coils PGS, SGS and, for example, are fashioned as bifilar wound solenoid coils.

Given this coil form, the current of adjacent windings has an alternating polarity and generates only a slight magnetic field with a short range that is on the order of a few cm.

As an alternative to this coil form, two coil layers can be wound atop one another with different current directions. The inductance of the tuning impedance can be set precisely by the spacing of such winding packets with observance of the limit conditions of the small range of the generated magnetic field.

No disruptive magnetic fields are formed by the solenoid form due to the tuning impedances ZVPRI1 through ZVPRI3 designed as coils.

The switches S1 through S3 are realized as terminals that are directed inward so that a closed switch can be made with the use of solder bridges in the surroundings of the gradient coil.

With the arrangement of the tuning impedances ZVPRI1 through ZVPRI3 within the gradient sub-coils PGS, SGS, the tuning impedances ZVPRI1 through ZVPRI3 are subjected to the same temperature drift as the impedances ZPRI and ZSEC.

In general, the primary gradient sub-coil PGS and the secondary gradient sub-coil SGS are designed as multi-part saddle coils.

For example, two saddle coil elements form the primary gradient sub-coil PGS and two saddle coil elements form the secondary gradient sub-coil SGS.

In this case, a saddle coil element is reasonably tuned as described in the preceding with the use of an associated tuning impedance.

Although modifications and changes may be suggested by those skilled in the art, it is the intention of the inventors to embody within the patent warranted hereon all changes and modifications as reasonably and properly come within the scope of their contribution to the art.

We claim as our invention:

1. An arrangement to reduce eddy currents in a gradient coil of a magnetic resonance apparatus, comprising:

a magnetic resonance gradient coil comprising a primary gradient sub-coil and a secondary gradient sub-coil connected in series with the primary gradient sub-coil;

said secondary gradient sub-coil being coupled with the primary gradient sub-coil to cause a gradient current to throw through both of said primary gradient sub-coil and said secondary gradient sub-coil, said gradient current having the same magnitude in each of said primary sub-coil and said secondary gradient sub-coil, and said gradient current flowing in a direction through said secondary gradient sub-coil that is opposite to a direction in which said gradient current flows in said primary gradient sub-coil;

said primary gradient sub-coil comprising a first impedance and said secondary gradient sub-coil comprising a second impedance; and a tuning impedance connected in parallel with at least one of said first and second impedances.

2. An arrangement as claimed in claim 1 wherein said tuning impedance comprises a first tuning impedance connected in parallel with said first impedance and a second tuning impedance connected in parallel with said second impedance.

3. An arrangement as claimed in claim 2 wherein each of said first and second tuning impedances is a potentiometer.

4. An arrangement as claimed in claim 1 wherein said tuning impedance is located outside of each of said primary gradient sub-coil and said secondary gradient sub-coil.

5. An arrangement as claimed in claim 1 wherein said first and second impedances are subject to a temperature drift, and wherein said tuning impedance is a potentiometer that is adjustable to correct for said temperature drift.

6. An arrangement as claimed in claim 2 wherein each of said first and second tuning impedances comprises a plurality of individual, discrete tuning impedances, and a plurality of switches connecting said individual, discrete tuning impedances together to form each of said first tuning impedance and said second tuning impedance.

7. An arrangement as claimed in claim 6 wherein said individual, discrete tuning impedances are located within said primary gradient sub-coil for said secondary gradient sub-coil, and wherein each of said individual, discrete tuning impedances is a solenoid coil.

8. An arrangement as claimed in claim 6 wherein each of said switches has terminals proceeding outside of said gradient coil, and wherein said arrangement comprises a connection unit connected to said terminals configured to selectively connect respective pairs of terminals together to close the switch connected to the connected-together terminals.

9. An arrangement as claimed in claim 1 wherein each of said primary gradient sub-coil and said secondary gradient sub-coil is a multi-part saddle coil, the saddle coil parts thereof being tuned by said tuning impedance.

* * * * *